United States Patent [19]

Palmer

[11] Patent Number: 5,577,932
[45] Date of Patent: Nov. 26, 1996

[54] COILED ELECTRICAL CORD RETAINER

[76] Inventor: James W. Palmer, P.O. Box 354, Beaumont, Calif. 92223

[21] Appl. No.: 443,723

[22] Filed: May 18, 1995

[51] Int. Cl.$^6$ ........................................................ H01B 7/06
[52] U.S. Cl. ................................................ 439/501; 206/702
[58] Field of Search ............................. 439/501; 206/702; 24/17 AP, 265 EE, 306

[56] References Cited

U.S. PATENT DOCUMENTS

| | | | |
|---|---|---|---|
| 3,008,571 | 7/1960 | Bond | 206/702 |
| 3,796,304 | 3/1974 | Blais | 206/702 |
| 4,583,797 | 4/1986 | Engelmore et al. | 439/22 |
| 4,878,586 | 11/1989 | Bancroft et al. | 206/702 |
| 5,188,307 | 2/1993 | Miller | 242/86 |
| 5,328,384 | 7/1994 | Magnuson | 439/369 |

Primary Examiner—Gary F. Paumen
Assistant Examiner—Jill DeMello
Attorney, Agent, or Firm—Albert O. Cota

[57] ABSTRACT

A coiled electrical cord retainer for a flexible stranded electrical cord which has a spring segment (22) with a smaller diameter than a coil of cord (48). The spring segment preferably has four turns and is contiguously attached to the plug end of a cord. The coiled cord is woven into the spirals and holds the coil together. A second embodiment places the spring segment (22) inside the cord's sheath. A third embodiment locates the spring segment (22) integral with the cord and attaches directly to an electrical appliance (54). A fourth embodiment utilizes a short length of cord or pigtail (82) with both a plug (50) and connector (52) on opposed ends. The pigtail (82) plugs into a power cable or extension cord and the coiled cord is retained in the same manner.

26 Claims, 3 Drawing Sheets

COILED ELECTRICAL CORD RETAINER

TECHNICAL FIELD

The invention pertains to the general field of cord retainers and more particularly to a retainer having a helical spring wrapping around a coil of cord.

BACKGROUND ART

Little has been accomplished in endeavoring to retain a coil of electrical cord such as an extension cord or a power cord for portable appliances including drill motors, saws, sanders, etc.

In the past, the cord is coiled up by hand and stored loosely or hung over a peg. Some people wrap a strap or tie a string around the coiled cord to keep it from coming loose. Some prior aft has tried to eliminate the problem particularly with telephone cords and small appliances with the use of a retracting spring inside the cord to shorten the cord when not in use, others have utilized roll up mechanisms that spring load a spool for retention. Cable reels that have collector rings and retracting springs have also been used for cable and cord storage.

A search of the prior art did not disclose any patents that read directly on the claims of the instant invention, however the following U.S. patents are considered related:

| U.S. Pat. No. | INVENTOR | ISSUED |
| --- | --- | --- |
| 5,328,384 | Magnuson | 12 July 1994 |
| 5,188,307 | Miller | 23 February 1993 |
| 4,583,797 | Engalmore et al | 22 April 1986 |
| (reissued under Re.32,805 Dec. 20, 1988) | | |
| 3,550,061 | Sukup | 22 December 1970 |
| Des. 324,669 | Co | 17 March 1992 |
| Des. 306,999 | Moore, et al | 3 April 1990 |

U.S. Pat. No. 5,328,384 issued to Magnuson teaches a retainer to hold the ends of two cords together with a clamping channel.

Miller's U.S. Pat. No. 5,188,307 is for a tool that coils up fire hoses for storage when flat.

Engelmore, et al patent with reissue U.S. Pat. No. Re. 32,805 is for a rotatable connector used with a coiled telephone cord.

U.S. Pat. No. 3,550,061 of Sukups is for a swivel connector permitting revolving of a cable that could be adaptable to rolling up for storage.

U.S. Pat. No. Des. 324,669 of Ky V. Co depicts a retracting extension cord device presumably on an internal reel with a knob for Tolling upon the reel.

Moore et al design U.S. Pat. No. Des. 306,999 is for marking a coiled retractile telephone cord.

It is apparent from this search that no effort has been placed on retaining of electrical cord or cable after it has been wound into a coil.

DISCLOSURE OF THE INVENTION

The need for some type of device to accomplish the retaining task for an electrical cord is obvious, with the instant invention fulfilling this need.

A primary object of the invention is directed to the ability of the device to hold and retain a coil of cord without using separate clamps, straps or other fasteners that are subject to misplacement or loss. This is accomplished using an integral helical spring segment that permits wrapping an end of the spring around the already coiled cord. It also eliminates the problem encountered when a cord is uncoiled only to find it backwards as so many extension cords have the plug and connector molded and look similar at a glance. When multiple extension cords are used, the problem is compounded and are easily tangled, however the invention inherently overcomes this difficulty.

An important object of the invention permits addition of the invention to existing cords by attaching the helical spring segment to the outside of the cord with shrink tubing or wrapping with electrical tape. Extension cords may be coiled uniformly without knotting and the life of the cord will be extended.

Another object of the invention is directed to a second embodiment that embeds the spring segment into the cord during the manufacturing process, thus eliminating installation while offering the same functional qualities with better appearance.

Still another object of the invention is the ability of the helical spring to be an extension of the ground system. The spring is metallic and an electrical conductor, therefore, the ground wire may be attached to each end of the spring eliminating redundancy in that section and permitting the outside diameter to not increase appreciably with the addition of the spring.

Yet another object of the invention in a third embodiment, allows the spring segment to be attached to an electrical appliance such as a hand tool, therefore the spring may also act as a shock absorber when the cord is pulled as the spring has resiliency or give.

This feature prevents pulling the cord from the appliance or at least loosening the connections. The invention may be attached directly to the tool in a number of methods based on use, all of which permit coiling the cord by hand and then winding the coil into the spring for containment.

A further object of the invention in a fourth embodiment utilizes a pigtail or short length of cord with the helical spring segment the entire length also a plug on one end and a connector on the other. This embodiment permits existing extension cords and power appliances to be plugged into the connector and become a continuation of the cord having all of the advantages of the other embodiments.

A final object of the invention is direct to the invention's ability to be used in other application such as a hose for air or water etc., where the spring segment may be attached to the extended end and function in the same manner by wrapping around the coiled hose.

These and other objects and advantages of the present invention will become apparent from the subsequent detailed description of the preferred and other embodiments also the appended claims, further, taken in conjunction with the accompanying drawings.

BEST MODE FOR CARRYING OUT THE INVENTION

The best mode for carrying out the invention is presented in terms of a first through fourth embodiment. All four embodiments are substantially the same except for the location and attachment methods. The preferred embodiment is for the spring segment to be added to an existing power or extension cord on the outside of the cord's sheath. The second embodiment for installation of the spring segment integral with the cord at the factory where the cord is made. The third embodiment connects directly to an appliance by various methods and the fourth embodiment is a pigtail that has both a plug and connector that is plugged into an existing cord and extends its utility without modification.

Figure 1:
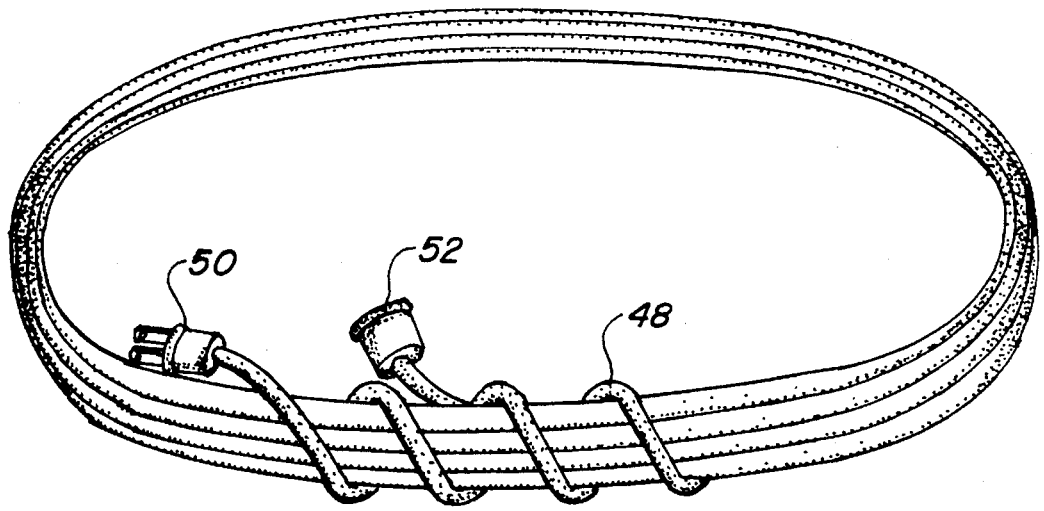
FIG. 1 is a partial isometric view of the preferred embodiment.
Figure 2:
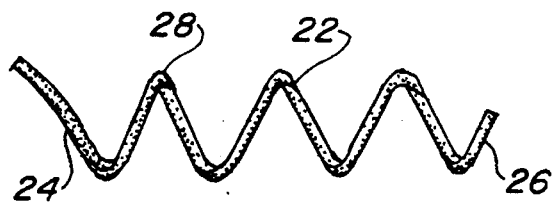
FIG. 2 is a partial isometric view of the constant diameter spring segment completely removed from the invention for clarity.
Figure 3:
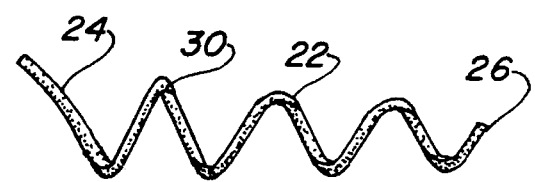
FIG. 3 is a partial isometric view of the tapered diameter spring segment completely removed from the invention for clarity.
Figure 4:
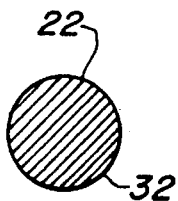
FIG. 4 is a cross sectional view of the spring segment in ting round configuration.
Figure 5:
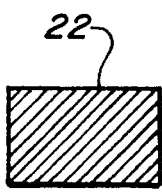
FIG. 5 is a cross sectional view of the spring segment in the rectangular configuration.
Figure 6:
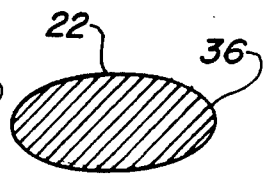
FIG. 6 is a cross sectional view of the spring segment in the oval configuration.
Figure 7:
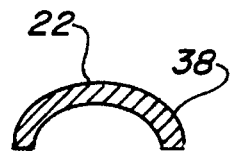
FIG. 7 is a cross sectional view of the spring segment in the concave configuration.
Figure 8:
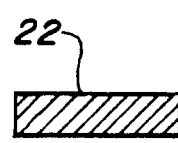
FIG. 8 is a cross sectional view of the spring segment in the flat configuration.
Figure 9:
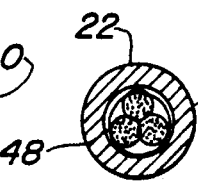
FIG. 9 is a cross sectional view of the spring segment in the round hollow configuration.
Figure 10:
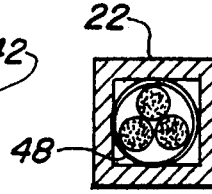
FIG. 10 is a cross sectional view of the spring segment in the square hollow configuration with the cord disposed inside.
Figure 11:
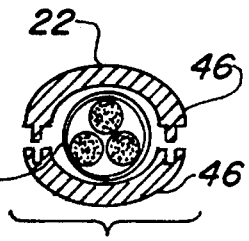
FIG. 11 is a cross sectional view of the spring segment in the two interconnecting halves configuration with the cord disposed inside.

The preferred embodiment, as shown in FIGS. 1 through 14 is comprised of a helical expanded compression spring segment 22. The spring is of a metallic material preferably high carbon steel or stainless steel with music wire, phosphor bronze, brass or the like, also acceptable. The spring segment 22 has a first end 24 and a second end 26 and an inside diameter less than the coiled electrical cord which it retains. The spring segment 22 may be a constant diameter 28 as depicted in FIG. 2 or a tapered diameter 30 with the first end 24 larger than the second end 26 as shown in FIG. 3 either one working equally well. It has been found that at least three turns of the spring segment 22 is required for optimum gripping however, other number of turns will still acceptably retain the coil of cord. The cross section of the spring material may be round 32 shown in FIG. 4, rectangular 34 shown in FIG. 5, oval 36 shown in FIG. 6, concave 38 shown in FIG. 7 or flat 40 shown in FIG. 8. The spring segment 22 may also have a cord disposed inside in a hollow configuration such as the round hollow 42 cross section of FIG. 9 or the square hollow 44 cross section of FIG. 10. Further, the spring segment 22 may even be made of two interconnecting halves 46 eliminating the problem of removing a plug or connector to install over a cord.

A stranded flexible cord 48 is positioned contiguous with the Spring segment 22. The cord 48 contains an electrical plug 50 and the first end 24 of the spring segment 22 is butted against this plug 50. This arrangement is best illustrated in FIG. 1. It will be noted that in this embodiment, the cord as may be the extension type with a connector 52 on one end and a plug 50 on the other of a power cord attached directly to an electrical appliance 54 each functioning equally well.

Figure 12:
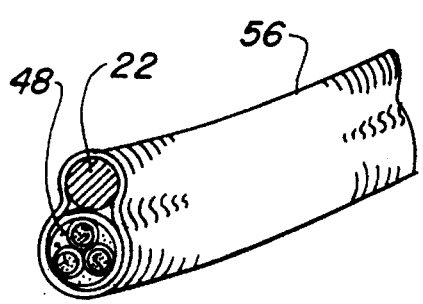
FIG. 12 is a fragmentary partial isometric view of the cord with the spring segment attached with shrink tubing.
Figure 13:
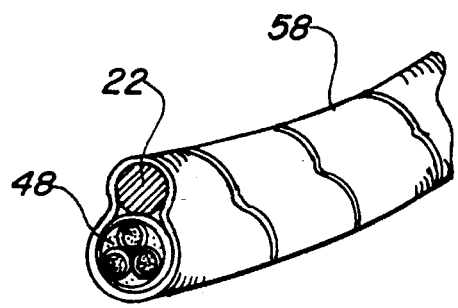
FIG. 13 is a fragmentary partial isometric view cord with the spring segment attached with electrical tape.

In either case, the spring segment 22 is affixed to the cord 48 with attaching means in the form of a length of heat shrink tubing 56 depicted in FIG. 12 or a length of vinyl plastic electrical tape 58 spirally wrapped around the spring and cord with the edges overlapping to form a complete cover. It heat shrink tubing 56 is utilized, the plug 50 or connector 52 is removed and the cord 48 and spring segment 22 threaded therethrough and the shrink tubing 56 is heated and retracts to a light fit enclosing the elements together.

Figure 14:
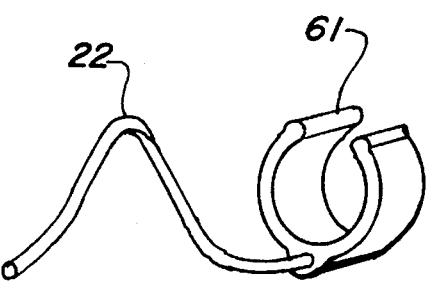
FIG. 14 is a partial isometric view of the spring segment having a keeper to aid in securing the spring to the cord in the first embodiment.

FIG. 14 illustrates another spring segment having a plastic or metal keeper 61 to aid in securing the loose end to the cord before applying the shrink tubing 56 or electrical tape 58.

The cord 48 containing the spring segment 22 is coiled up in a normal manner and the entire coil is then woven into the spirals of the spring as illustrated in FIG. 1. The same system is used when a number of extensions cords are plugged together or when a power cord is used.

The second embodiment is depicted in FIGS. 1–8 and 15, and contains exactly the same spring segment 22 except it is embedded in the cord 48 during manufacturer. This eliminates the need for the attaching means and the hollow configurations of the spring.

Figure 15:
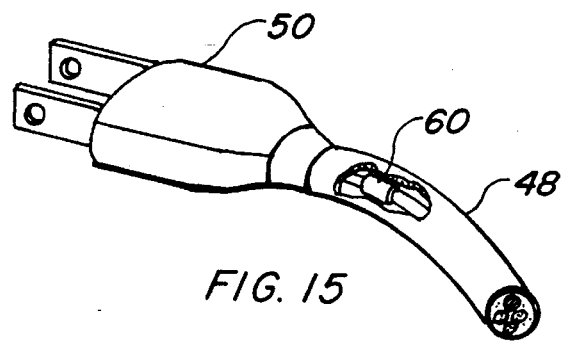
FIG. 15 is a fragmentary partial isometric view cord and plug with the spring segment embedded in the cord.

FIG. 15 illustrates the spring segment 22 in the center of the cord 48 however, it may be positioned in any relationship provided it is enclosed within the cords as sheath.

An advantage of having the spring section within the cord 48 is the ability of using the metallic material of the spring segment 22 as part of the ground conductor. A mechanical connector 60 attaches the ground wire in the cord to the both the first end 24 and second end 26 continuing the ground circuit through the spring segment 22 without appreciably increasing the outside diameter of the cord 48.

The balance of the configurations of the spring cross section and the retainers function are the same as the preferred embodiment.

The third embodiment is illustrated in FIGS. 15–20 and is directed to the inventions attachment to an electrical appliance 54 such as a portable hand tool or the like. The spring segment 22 is preferably embedded in the cord 48 at the factory, the same as the second embodiment however, the retainer is adjacent to the appliance 54 rather than the plug 50 and is attached with connecting means.

Figure 16:
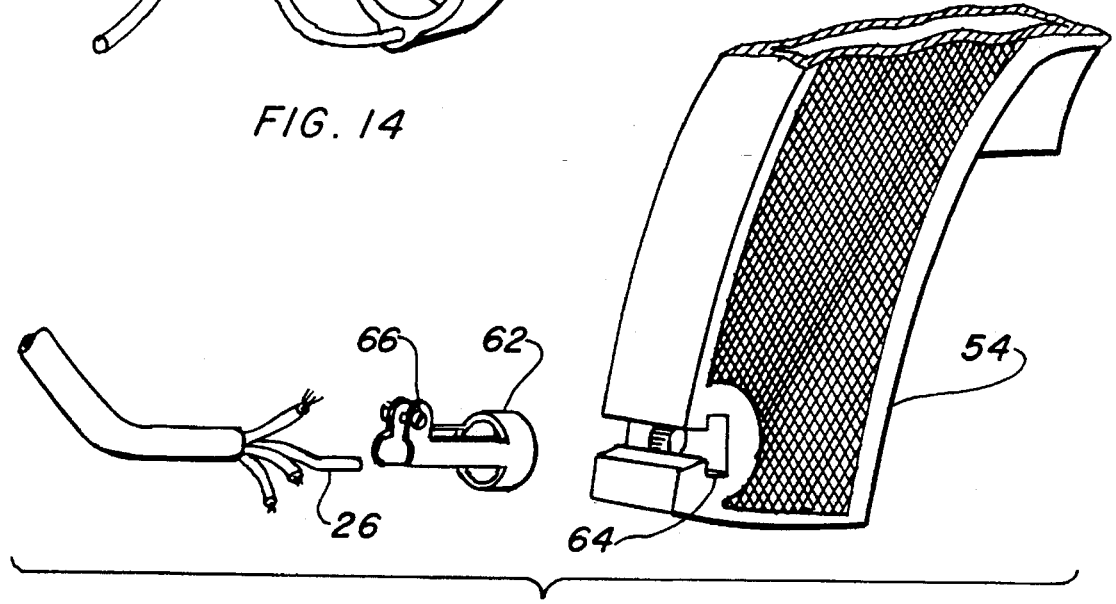
FIG. 16 is an exploded partial isometric view of the attaching bracket disposed within a keyway slot of an appliance.

The Spring segment 22 may be attached as shown in FIG. 16 with a bracket 62 disposed within a keyway slot 64 in the appliance 54. A pair of compression fingers 66 grip the flexible cord 48 and are held in tension with a screw 66.

Figures 17, 18:
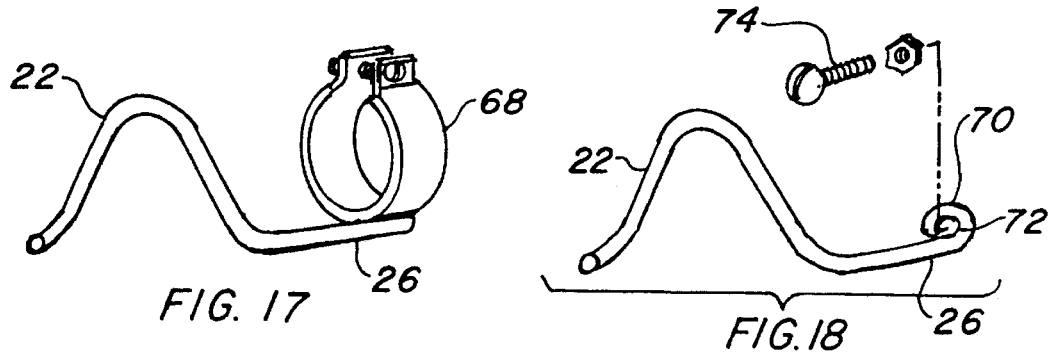
FIG. 17 is a partial isometric view of the bolt on clamp attached to the spring segment completely removed from the invention for clarity.
FIG. 18 is a partial isometric view of the screw on clamp attached to the spring segment completely removed from the invention for clarity.

FIG. 17 depicts another form of the connecting means using a bolt on clamp 68 that tightens onto a rounded portion of the appliance 54.

FIG. 18 illustrates a screw on clamp 70 formed integrally with the second end 26 of the spring segment 22. A loop 72 is formed through which a threaded fastener 74 penetrates and attaches directly to the appliance 54.

Figures 19, 20:
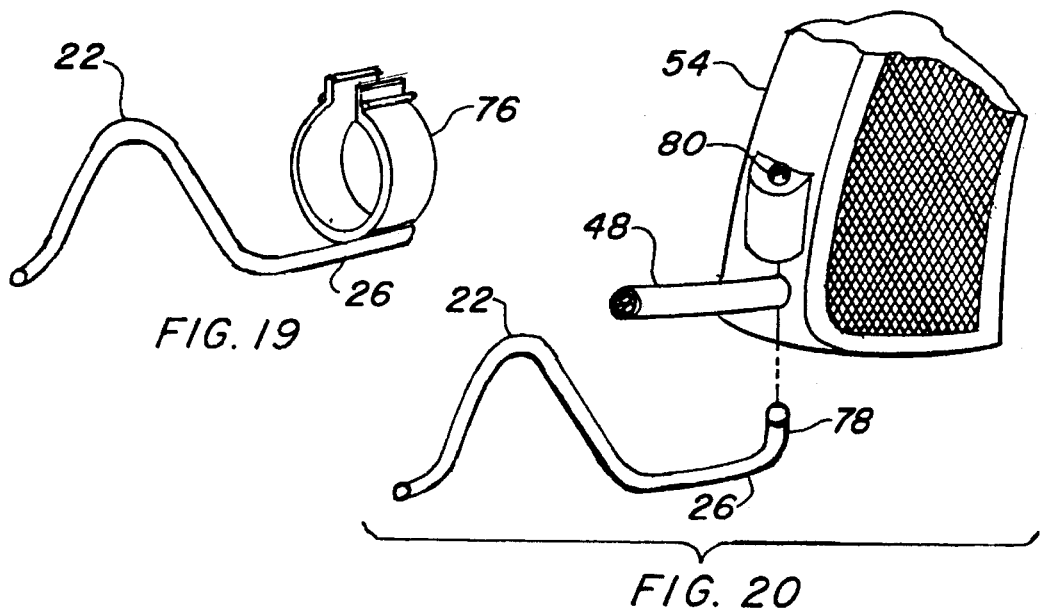
FIG. 19 is a partial isometric view of the snap on clamp attached to the spring segment completely removed from the invention for clarity.
FIG. 20 is an exploded partial isometric view upstanding bend in the spring segment for mounting.

FIG. 19 shows a snap on clamp 76 using spring tension to hold to a round portion of an appliance 54.

FIG. 20 visually indicates an upstanding bend 78 on the spring second end 26 that interfaces with a socket 80 in an appliance 54.

The balance of the configurations of the springs cross sections and retainers function are the same as the preferred embodiment.

Figure 21:
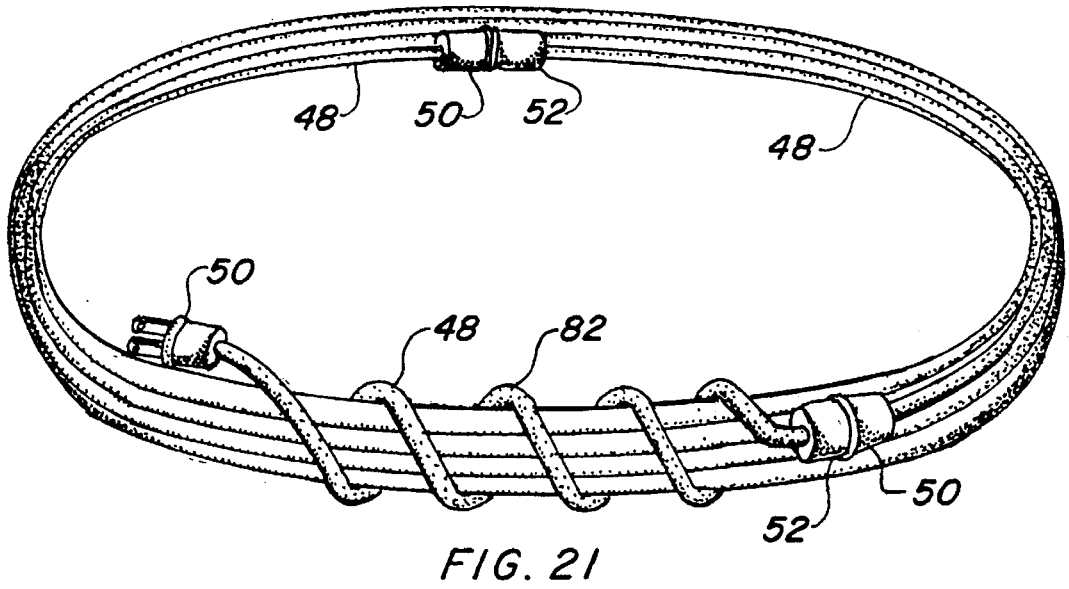
FIG. 21 is a partial isometric view of the pigtail embodiment of the invention wrapped around a coiled extension cord.

The fourth embodiment is found pictorially in FIG. 21 and is the same as the second embodiment except a short section of flexible cord 48 is used and a plug 50 is on one end and a connector 52 on the other forming a pigtail 82. The only difference being that the retainer is used to extend a power cable or extension cord by plugging into the connector as shown, with the utility remaining exactly the same.

When two extension cords, each having attached pigtails 82 are interconnected, one of the pigtails is not required and may cause an obstruction or be damaged. Therefore, the pigtails 82 are designed to be easily attached and easily removed when not required.

It should be noted that the invention is looking towards electrical cords or cables, however, the same type of spring retention may be directed to any hose or conduit for transferring fluids such as vapor or liquid.

While the invention has been described in complete detail and pictorially shown in the accompanying drawings it is not to be limited to such details, since many changes and modifications may be made in the invention without departing from the spirit and scope thereof. Hence, it is described to cover any and all modifications and forms which may come within the language and scope of the appended claims.

I claim:

1. A coiled electrical cord retainer and stranded flexible cord assembly comprising:
   (a) the retainer comprising a helical expanded compression spring segment having a first end and a second end,
   (b) said spring segment having an inside diameter less than that of the stranded flexible cord,
   (c) the stranded flexible cord having a plug on one end with the cord contiguous with the spring segment and the spring segment first end butted against the plug, and
   (d) attaching means to affix the cord to the spring segment; wherein a combination of the cord and the spring segment forms a retainer such that wrapping the retainer around a coil of the cord secures the cord for storage.

2. The assembly as recited in claim 1 wherein said compression spring segment is a constant diameter.

3. The assembly as recited in claim 1 wherein said compression spring segment is tapered in diameter with the first and larger than the second end.

4. The assembly as recited in claim 1 wherein said compression spring segment has at least three turns.

5. The assembly as recited in claim 1 wherein said compression spring segment has a round cross section.

6. The assembly as recited in claim 1 wherein said compression spring segment has a rectangular cross section.

7. The assembly as recited in claim 1 wherein said compression spring segment has a oval cross section.

8. The assembly as recited in claim 1 wherein said compression spring segment has a concave cross section.

9. The assembly as recited in claim 1 wherein said compression spring segment has a flat cross section.

10. The assembly as recited in claim 1 wherein said compression spring segment has a hollow cross section with the cord disposed inside.

11. The assembly as recited in claim 1 wherein said compression spring segment further comprises two interconnected halves having opposed keys fitted together into a hollow round cross section with the cord disposed inside.

12. The assembly as recited in claim 1 wherein said attaching means further comprises a length of heat shrink tubing that contracts contiguously around the spring segment and the cord when subjected to heat.

13. The assembly as recited in claim 1 wherein said attaching means further comprises a length of vinyl plastic electrical tape spirally wrapped about the spring segment and the cord with edges overlapped to form a complete covering.

14. The assembly as recited in claim 1 wherein said attaching means further comprising a keeper having an inside diameter the same as a cord outside diameter with the keeper disposed linearly on one end of the spring segment.

15. A coiled electrical cord retainer and stranded flexible cord assembly comprising:
   (a) the cord retainer comprising a helical expanded compression spring segment having a first end and a second end,
   (b) said spring segment having an inside diameter less than that of the stranded flexible cord,
   (c) the stranded flexible cord having a sheath and a plug on one end, and
   (d) said spring segment disposed within said cord sheath and adjacent to the plug; wherein a combination of the cord and the spring segment forms a retainer such that wrapping the retainer around a coil of the cord secures the cord for storage.

16. The assembly as recited in claim 15 wherein said compression spring segment is a constant diameter.

17. The assembly as recited in claim 15 wherein said compression spring segment is tapered in diameter with the first end larger than the second end.

18. The assembly as recited in claim 15 wherein said compression spring segment has no more than four turns.

19. The assembly as recited in claim 15 further comprising a mechanical connection upon the first and second ends of the spring segment permitting ground wires to be attached on each end for continuing a ground circuit through the entire spring segment.

20. A coiled electric cord retainer and stranded flexible cord assembly attached to an electrical appliance comprising:
   (a) the cord retainer comprising a helical expanded compression spring segment having a first end and a second end, (b) said spring segment having an inside diameter less than that of the stranded flexible cord, (c) the stranded flexible cord attached to an electrical appliance having a sheath and a plug on an extended end, (d) said spring segment disposed within said cord sheath adjacent to an appliance, and (e) connecting means to fasten the second end of the spring segment to an electrical appliance, wherein a combination of the cord and the spring segment forms a retainer such that wrapping the retainer around a coil of the cord secures the cord for storage.

21. The assembly as recited in claim 20 wherein said connecting means further comprises a bracket disposed within a keyway slot in an appliance, said bracket having a pair of compression fingers for gripping the flexible cord under urging of a screw.

22. The assembly as recited in claim 20 wherein said connecting means further comprises a bolt on a clamp fastened to said second end of the spring segment for connection to an electrical appliance.

23. The assembly as recited in claim 20 wherein said connecting means further comprises a screw on clamp formed integrally with the second end of the spring segment forming a looped shape with a threaded fastener penetrating the loop fop rigid connection of the fastener to an electrical appliance.

24. The assembly as recited in claim 20 wherein said connecting means further comprises a snap on clamp attached to the second end of the spring segment urgingly holding the retainer to an appliance by spring tension.

25. The assembly as recited in claim 20 wherein said connecting means further comprises an upstanding bend on the second end of the spring segment and an appliance having a female socket therein with the upstanding bend grippingly interfacing with the socket.

26. A coiled electrical cord retainer and stranded flexible cord assembly comprising:

(a) the cord retainer comprising helical expanded compression spring segment having a first end and a second end, (b) said spring segment having an inside diameter less than that of the stranded flexible cord, (c) the stranded flexible cord having a sheath surrounding the cord, a plug on one end and a connector on another end, and (d) said spring segment disposed within said cord sheath with the first end adjacent to the plug and the second end adjacent to the connector, wherein a combination of the cord and the spring segment forms a retainer such that wrapping the retainer around a coil of the cord that is plugged into the connector secures the cord for storage.

* * * * *